US008507357B2

United States Patent
Lin et al.

(10) Patent No.: US 8,507,357 B2
(45) Date of Patent: Aug. 13, 2013

(54) METHOD FOR LIFT-OFF OF LIGHT-EMITTING DIODE SUBSTRATE

(75) Inventors: Su-Hui Lin, Xiamen (CN); Sheng-Hsien Hsu, Xiamen (CN); Kang-Wei Peng, Xiamen (CN); Jiansen Zheng, Xiamen (CN); Jyh-Chiarng Wu, Xiamen (CN); Keehuang Lin, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 13/352,812

(22) Filed: Jan. 18, 2012

(65) Prior Publication Data

US 2012/0190148 A1 Jul. 26, 2012

(30) Foreign Application Priority Data

Jan. 21, 2011 (CN) .......................... 2011 1 0024096

(51) Int. Cl.
*H01L 21/0242* (2006.01)
(52) U.S. Cl.
USPC ........ 438/429; 257/76; 257/44; 257/E33.025; 257/E29.089; 257/E21.54
(58) Field of Classification Search
USPC .............. 257/631, 617, 618, 622, 94, 95, 76, 257/97, 98, 103, 99, E33.025, E29.089, E21.54; 438/143, 407, 471, 511, 797, 459, 113, 46, 438/47, 42, 429
See application file for complete search history.

(56) References Cited

U.S. PATENT DOCUMENTS

| 7,846,820 | B2* | 12/2010 | Ishibashi et al. | 438/481 |
| 7,976,637 | B2* | 7/2011 | Nagaike et al. | 134/1.3 |
| 8,026,156 | B2* | 9/2011 | Lee et al. | 438/481 |
| 8,119,534 | B2* | 2/2012 | Tanaka et al. | 438/734 |
| 2009/0152565 | A1* | 6/2009 | Brandes et al. | 257/76 |
| 2009/0267098 | A1* | 10/2009 | Choi | 257/98 |
| 2010/0163839 | A1* | 7/2010 | Wuu et al. | 257/9 |
| 2010/0219442 | A1* | 9/2010 | Lee | 257/99 |
| 2012/0032296 | A1* | 2/2012 | Kosaka et al. | 257/528 |

FOREIGN PATENT DOCUMENTS

| CN | 101432850 A | | 5/2009 |
| CN | 101866880 A | | 10/2010 |
| JP | 2007200929 A | * | 8/2007 |
| KR | 20100063790 | * | 7/2010 |

* cited by examiner

*Primary Examiner* — Jerome Jackson, Jr.
*Assistant Examiner* — Bo Fan
(74) *Attorney, Agent, or Firm* — Fulbright & Jaworski LLP

(57) ABSTRACT

The present invention discloses a method for lift-off of an LED substrate. By eroding the sidewall of a GaN epitaxial layer, cavity structures are formed, which may act in cooperation with a non-fully filled patterned sapphire substrate from epitaxial growth to cause the GaN epitaxial layer to separate from the sapphire substrate. The method according to an embodiment of the present invention can effectively reduce the dislocation density in the growth of a GaN-based epitaxial layer; improve lattice quality, and realize rapid lift-off of an LED substrate, and has the advantages including low cost, no internal damage to the GaN film, elevated performance of the photoelectric device and improved luminous efficiency.

7 Claims, 3 Drawing Sheets

METHOD FOR LIFT-OFF OF LIGHT-EMITTING DIODE SUBSTRATE

The present application claims the benefit of Chinese patent application No. 201110024096.1 titled "Method for Lift-off of Light-Emitting Diode Substrate" and filed with the State Intellectual Property Office on Jan. 21, 2011, which is incorporated herein by reference in its entirety.

FIELD OF THE INVENTION

The present invention relates to a method for lift-off of a light-emitting diode (LED) substrate, and in particular to a non-laser based method for lift-off of a sapphire substrate used in the manufacturing of a gallium nitride (GaN) based high-brightness LED.

BACKGROUND OF THE INVENTION

An LED is a light-emitting semiconductor device based on the electroluminescence of the P-N junction of a semiconductor. LEDs have the advantages including pollution free, high brightness, low power consumption, long life cycle, low operating voltage and small-scaled. Since the invention of the GaN-based LED in the 1990s, with the developments in the studies, the brightness of LEDs has been continuously improved, and the application range has become increasingly wider. It seems inevitable that GaN-based LEDs will replace the existing lighting equipment. However, for the popularization of semiconductor lighting, a number of problems are still left to be solved, among which the most important one lies in production cost and luminous efficiency.

The structures of an LED can be classified into two categories: lateral and vertical. A high-power GaN-based LED with a lateral structure in which sapphire is used as a growth substrate has the disadvantages including low heat dissipation efficiency, current crowding, low current density and high production cost. In order to solve the heat dissipation problem of the high-power GaN-based LED with a lateral structure, the technique of flip chip has been proposed. However, the processing steps of flip chip are complex and the production cost is high. A conventional GaN-based LED with a vertical structure in which a SiC wafer is used as the original growth substrate includes two electrodes at respective sides of the growth substrate, and has the advantages such as good heat dissipation efficiency, uniform current distribution, improved current crowding, increased current density and effective utilization of the material of the light-emitting layer. A conventional GaN-based LED with a vertical structure in which sapphire is used as the original growth substrate includes two electrodes at respective sides of a support substrate, and has the advantages such as high heat dissipation efficiency, uniform current distribution, improved current crowding, increased current density, effective utilization of the material of the light-emitting layer and high light-extraction efficiency. Sapphire is an electrical insulating material, and hence lift-off of the growth substrate is needed. Nichia Corporation in Japan and Osram in Germany have developed techniques for laser lift-off of the sapphire substrate used in the manufacturing of LED chips with a vertical structure. These techniques can effectively solve the heat dissipation and light escape problems, make it possible for a microstructure to be formed on an N-face, improve light extraction efficiency, and allow for reuse of the sapphire. By employing the laser lift-off techniques in conjunction with bonding technology, the epitaxial layer of a GaN-based LED can be moved onto a substrate having a high electrical conductivity (e.g., Si, Cu, or Al), thereby avoiding undesired effects by the sapphire substrate on the GaN-based LED. However, this approach has the following problems: (1) laser lift-off may crack the GaN film internally, causing electrical leakage; (2) the heat generated in the process of laser lift-off of a sapphire substrate is high, since the wafer bonding layer is just several micrometers away from the interface between the sapphire substrate and GaN, the bonding layer is likely to be affected (e.g., remelt); and (3) the laser lift-off techniques are not compatible with earlier processing processes, and the machines and tools are costly.

SUMMARY OF THE INVENTION

In order to solve the problems above of an LED, an object of the present invention is to provide a method for lift-off of an LED substrate, which can effectively reduce the dislocation density in the growth of a GaN-based epitaxial layer, improve lattice quality, and realize rapid lift-off of an LED substrate, and has the advantages including low cost, no internal damage to the GaN film, elevated performance of the photoelectric device and improved luminous efficiency.

According to an embodiment of the present invention, it is provided a method for lift-off of an LED substrate, including:
1) providing a sapphire substrate;
2) forming pattern structures on a surface of the substrate, the pattern structures being periodically distributed;
3) depositing a blocking layer on the patterned sapphire substrate, and performing polishing on the blocking layer so that a surface of the blocking layer is flush with surfaces of projections of the patterned sapphire substrate;
4) growing a GaN epitaxial layer on the patterned sapphire substrate, so that cavity structures are formed between the GaN epitaxial layer and the patterned sapphire substrate, the GaN epitaxial layer including an N—GaN layer, a quantum well layer and a P—GaN layer; and
5) eroding a sidewall of the GaN epitaxial layer by wet etching, so that the GaN epitaxial layer is separated from the sapphire substrate.

Preferably, the method may further include: depositing a transitional layer on the sapphire substrate; forming a patterned transitional layer with periodically distributed patterns, by masking and etching; and, removing the transitional layer so as to form the periodically distributed pattern structures on the surface of the substrate.

According to an embodiment of the present invention, the material of the blocking layer may be any one or any combination of: $SiO_2$, $SiN_x$ and $TiO_2$; the pattern structures on the sapphire substrate may be rectangle-shaped or polygon-shaped; the material of the transitional layer may be any one or any combination of: $SiO_2$, $SiN_x$ and $TiO_2$; the polishing may be chemical polishing, mechanical polishing or chemical-mechanical polishing; the wet etching may use an etchant that includes any one or any combination of: HF, $NH_4F$, $CH_3COOH$, $H_2SO_4$ and $H_2O_2$.

In the method according to an embodiment of the present invention, the patterned substrate is filled with a blocking layer, resulting in a filled patterned substrate; then, a GaN epitaxial layer is grown on the substrate, since the GaN epitaxial layer cannot be grown on the portions of the surface of the substrate that are filled with the blocking layer, cavity structures are formed between the GaN epitaxial layer and the patterned sapphire substrate. By wet etching, the sidewall of the GaN epitaxial layer is eroded and the blocking layer can be removed, resulting in cavity structures, which may act in cooperation with the non-fully filled patterned sapphire substrate from epitaxial growth to cause the GaN epitaxial layer to separate from the sapphire substrate.

The method according to an embodiment of the present invention may bring the following advantageous effects. The dislocation density in the growth of a GaN-based epitaxial layer can be effectively reduced; lattice quality can be improved without any internal damage to the GaN film; performance of the photoelectric device can be elevated; and luminous efficiency can be improved.

BRIEF DESCRIPTION OF THE DRAWINGS

FIG. 1—LED substrate showing a $SiO_2$ transitional layer 2 and a sapphire substrate 1.

FIG. 2—LED substrate showing a patterned $SiO_2$ transitional layer 2.

FIG. 3—LED substrate without a transitional layer.

FIG. 4—LED substrate showing a $SiO_2$ blocking layer 3 on the patterned sapphire substrate of FIG. 3.

FIG. 5—LED substrate showing cavities (4) and a GaN epitaxial layer made of an N—GaN layer 5, a quantum well layer 6 and a P—GaN layer 7, on the patterned sapphire substrate 1.

FIG. 6—LED substrate showing a $SiN_x$ protective layer 8 on the P—GaN layer of FIG. 5.

FIG. 7—LED substrate showing the sidewall of the GaN epitaxial layer eroded by wet etching.

FIG. 8—LED substrate showing the sidewall of the GaN epitaxial layer eroded by wet etching, where the GaN epitaxial layer separates.

In the figures as described above:
1=sapphire substrate; 2=transitional layer; 3=blocking layer; 4=cavity structures of epitaxial layer; 5=N—GaN layer; 6=quantum well layer; 7=P—GaN layer; 8=protective layer; 9,10=etched cavity structures.

DETAILED DESCRIPTION OF THE INVENTION

The present invention will be described hereinafter in detail in conjunction with the embodiments.

The present invention will be described hereinafter in detail in conjunction with the accompanying drawings and the embodiments.

Figure 1:
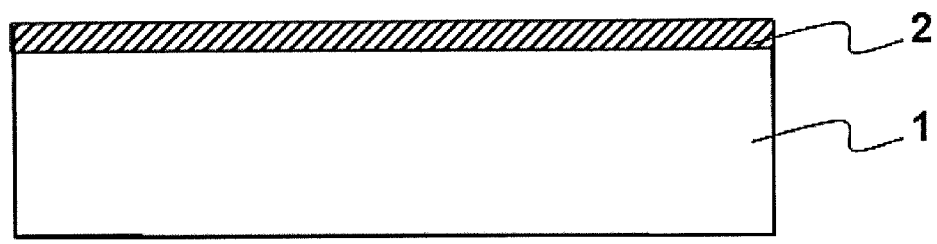
FIGS. 1 to 8 illustrate the processing flow of a method for lift-off of an LED substrate according to an embodiment of the present invention with cross-sectional views. More specifically.

As shown in FIG. 1, a $SiO_2$ transitional layer 2 is deposited on a sapphire substrate 1.

Figure 2:
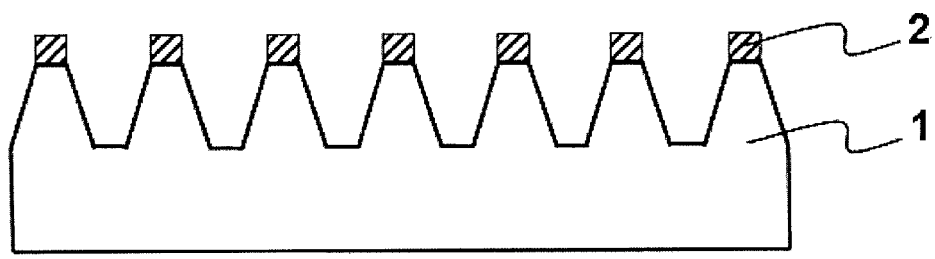

As shown in FIG. 2, a patterned $SiO_2$ transitional layer 2 with periodically distributed rectangular patterns is formed by masking and etching.

Figure 3:
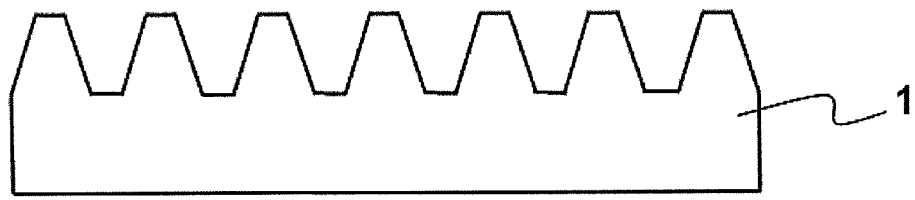

As shown in FIG. 3, a transitional layer is removed so as to form a patterned sapphire substrate 1.

Figure 4:
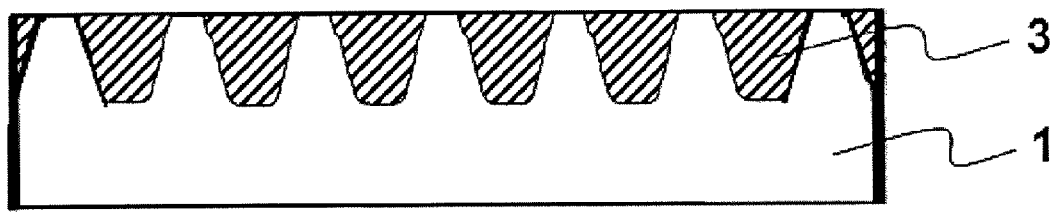

As shown in FIG. 4, a $SiO_2$ blocking layer 3 is formed on the sapphire substrate, and chemical-mechanical polishing is performed on the $SiO_2$ blocking layer 3 so that the surface of the $SiO_2$ blocking layer 3 is flush with surfaces of projections of the patterned sapphire substrate 1.

Figure 5:
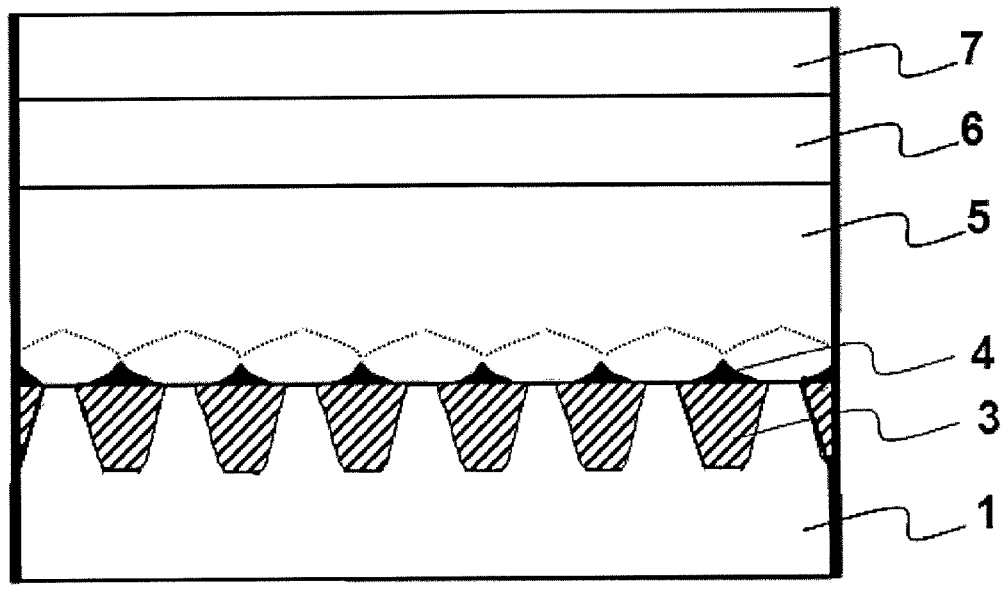

As shown in FIG. 5, a GaN epitaxial layer is grown on the patterned sapphire substrate 1, cavity structures 4 are formed between the GaN epitaxial layer and the patterned sapphire substrate. The GaN epitaxial layer includes an N—GaN layer 5, a quantum well layer 6 and a P—GaN layer 7.

Figure 6:
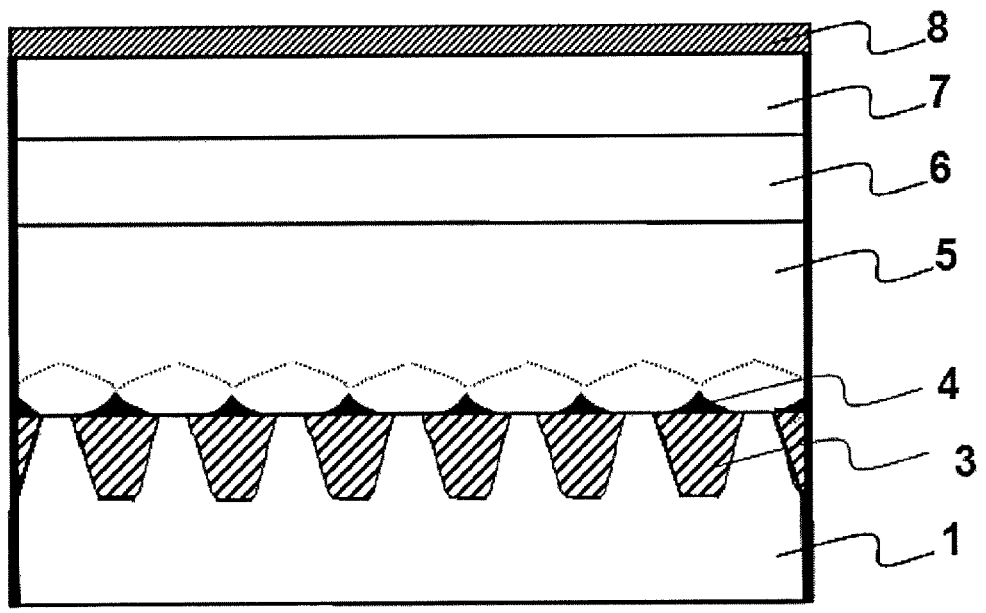

As shown in FIG. 6, a $SiN_x$ protective layer 8 is deposited on the P—GaN layer 7, and chips of a defined size are obtained from dicing with a diamond blade.

Figure 7:
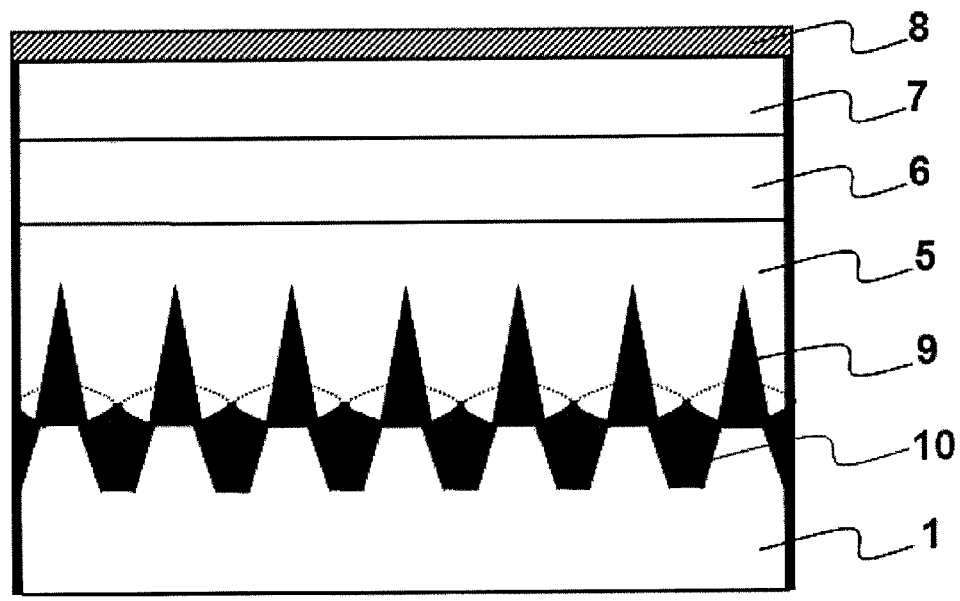
Figure 8:
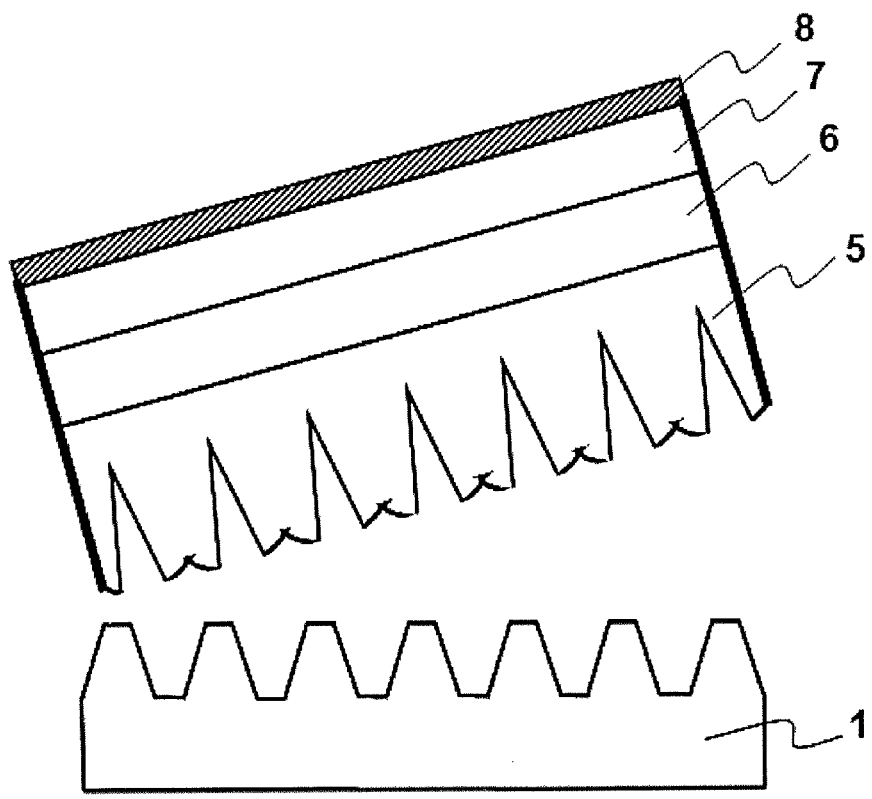

As shown in FIGS. 7 and 8, the sidewall of the GaN epitaxial layer is eroded by wet etching, resulting in cavity structures 9 and 10, which may act in cooperation with the cavity structures 4 to cause the GaN epitaxial layer to separate from the sapphire substrate. The etchant used in the wet etching may include any one or any combination of: HF, $NH_4F$, $CH_3COOH$, $H_2SO_4$ and $H_2O_2$.

The embodiments above are for illustrative purposes only, and should not be considered as limiting the present invention. Those skilled in the art may make various alternations and modifications without deviation from the spirit and scope of the present invention; therefore, all the equivalents should fall within the scope of protection of the present invention which is defined by the claims attached.

The invention claimed is:

1. A method for lift-off of a light-emitting diode (LED) substrate, comprising:
   1) providing a sapphire substrate;
   2) forming pattern structures on a surface of the substrate, the pattern structures being periodically distributed;
   3) depositing a blocking layer on the patterned sapphire substrate, and performing polishing on the blocking layer so that the entire upper surface of the blocking layer is flush with surfaces of projections of the patterned sapphire substrate;
   4) growing a GaN epitaxial layer on the patterned sapphire substrate, so that cavity structures are formed between the GaN epitaxial layer and the patterned sapphire substrate, wherein the GaN epitaxial layer comprises an N-GaN layer, a quantum well layer and a P-GaN layer; and
   5) eroding a sidewall of the GaN epitaxial layer by wet etching, so that the GaN epitaxial layer is separated from the sapphire substrate.

2. The method for lift-off of an LED substrate according to claim 1, further comprising:
   depositing a transitional layer on the sapphire substrate;
   forming a patterned transitional layer with periodically distributed patterns, by masking and etching; and
   removing the transitional layer so as to form the periodically distributed pattern structures on the surface of the substrate.

3. The method for lift-off of an LED substrate according to claim 2, wherein the material of the transitional layer is any one or any combination of: $SiO_2$, $SiN_x$ and $TiO_2$.

4. The method for lift-off of an LED substrate according to claim 1, wherein the pattern structures on the sapphire substrate is rectangle-shaped or polygon-shaped.

5. The method for lift-off of an LED substrate according to claim 1, wherein the material of the blocking layer is any one or any combination of: $SiO_2$, $SiN_x$ and $TiO_2$.

6. The method for lift-off of an LED substrate according to claim 1, wherein the polishing is chemical polishing, mechanical polishing or chemical-mechanical polishing.

7. The method for lift-off of an LED substrate according to claim 1, wherein the wet etching uses an etchant that comprises any one or any combination of: HF, $NH_4F$, $CH_3COOH$, $H_2SO_4$ and $H_2O_2$.

* * * * *

UNITED STATES PATENT AND TRADEMARK OFFICE
CERTIFICATE OF CORRECTION

PATENT NO.        : 8,507,357 B2
APPLICATION NO.   : 13/352812
DATED             : August 13, 2013
INVENTOR(S)       : Su-Hui Lin et al.

It is certified that error appears in the above-identified patent and that said Letters Patent is hereby corrected as shown below:

Title Page, item (75) Inventors, line 5, delete "Keehuang" and insert --Kechuang-- therefor.

Signed and Sealed this
Nineteenth Day of November, 2013

Teresa Stanek Rea
*Deputy Director of the United States Patent and Trademark Office*